(12) United States Patent
Chen et al.

(10) Patent No.: US 9,035,706 B2
(45) Date of Patent: May 19, 2015

(54) VARIABILITY AND AGING SENSOR FOR INTEGRATED CIRCUITS

(71) Applicant: Texas Instruments Incorporated, Dallas, TX (US)

(72) Inventors: Min Chen, San Diego, CA (US); Vijay Kumar Reddy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/157,009

(22) Filed: Jan. 16, 2014

(65) Prior Publication Data

US 2014/0197895 A1    Jul. 17, 2014

Related U.S. Application Data

(60) Provisional application No. 61/753,655, filed on Jan. 17, 2013.

(51) Int. Cl.
*H03K 3/03* (2006.01)
*G01R 31/28* (2006.01)
*G01R 31/317* (2006.01)

(52) U.S. Cl.
CPC ........ *H03K 3/0315* (2013.01); *G01R 31/31725* (2013.01); *G01R 31/2882* (2013.01)

(58) Field of Classification Search
CPC .................................................. H03K 3/0315
USPC ..................................................... 331/57, 55
See application file for complete search history.

(56) References Cited

U.S. PATENT DOCUMENTS

| | | | | |
|---|---|---|---|---|
| 4,517,532 A | * | 5/1985 | Neidorff | 331/57 |
| 7,307,471 B2 | | 12/2007 | Gammie et al. | |
| 7,570,104 B2 | * | 8/2009 | Hsu | 327/536 |
| 7,710,208 B2 | * | 5/2010 | Goff | 331/57 |
| 7,733,189 B1 | * | 6/2010 | Bennett | 331/64 |
| 7,760,033 B2 | | 7/2010 | Podmanik et al. | |
| 7,793,119 B2 | | 9/2010 | Gammie et al. | |

OTHER PUBLICATIONS

Gordon Gammie, et al., "SmartReflex Power and Performance Management Technologies for 90nm, 65nm, and 45nm Mobile Application Processors", Proceedings of the IEEE, vol. 98, No. 2, Feb. 2010, pp. 144-159.

* cited by examiner

*Primary Examiner* — Joseph Chang
(74) *Attorney, Agent, or Firm* — Jacqueline J. Garner; Frank Cimino (57) ABSTRACT

A ring-oscillator-based on-chip sensor (OCS) includes a substrate having a semiconductor surface upon which the OCS is formed. The OCS includes an odd number of digital logic stages formed in and on the semiconductor surface including a first stage and a last stage each including at least one NOR gate including a first gate stack and/or a NAND gate including a second gate stack. A feedback connection is from an output of the last stage to an input of the first stage. At least one discharge path including at least a first p-channel metal-oxide semiconductor (PMOS) device is coupled between the first gate stack and a ground pad, and/or at least one charge path including at least a first n-channel metal-oxide semiconductor (NMOS) device is coupled between the second gate stack a power supply pad.

17 Claims, 6 Drawing Sheets

VARIABILITY AND AGING SENSOR FOR INTEGRATED CIRCUITS

CROSS REFERENCE TO RELATED APPLICATIONS

This application claims the benefit of Provisional Application Ser. No. 61/753,655 entitled "A ROBUST VARIABILITY AND AGING SENSOR FOR HIGH-K/METAL GATE SoC", filed Jan. 17, 2013, which is herein incorporated by reference in its entirety.

FIELD

Disclosed embodiments relate to ring oscillator circuits for monitoring to allow compensating for process variations and aging for integrated circuits including n-channel metal-oxide semiconductor (NMOS) and/or p-channel metal-oxide semiconductor (PMOS) field effect transistors.

BACKGROUND

An integrated circuit (IC or chip) generally comprises a plurality of circuit paths. A "circuit path" may be interpreted to mean arrangements of electronic circuitry components through which electrical current may flow when biased. Each path generally comprises a plurality of transistors and other elements such as resistors and capacitors, along with parasitics. In some cases, each path may be designed to perform a specific function. One of these paths may be the most poorly-performing (i.e., slowest) path, due to any of a variety of reasons, such as circuit complexity. The circuit path that limits the overall performance frequency of other circuit paths and/or the load itself may be termed herein the "critical path."

Any of a variety of factors, such as temperature, voltage, manufacturing variation and other factors not specifically disclosed herein may affect the speed of the critical path, as well as that of any of the other circuit paths. For example, because the voltage supplied to a circuit path is applied to some or all of the transistors in the circuit path, the voltage dictates, at least in part, the performance of the transistors in the path. In turn, the performance of the transistors dictates, at least in part, the speed of the circuit path itself. Thus, if a voltage that is delivered to a circuit path is undesirably high or low (i.e., the voltage has been substantially altered by various circuit components and phenomena between a voltage source and the circuit path), the performance speed of the circuit path may likewise be undesirably high or low.

In some cases, such factors may impact the speed of the critical path and/or another path such that the speed of the path may become excessively low or excessively high. If the speed becomes excessively low, the path and/or the load may cease to function. Conversely, if the speed becomes excessively high, the chip and/or the load may waste power or even become damaged.

A system on a chip or system on chip (SoC or SOC, hereafter SOC) is an IC which integrates all components of a computer or other electronic system into a single chip/die. The SOC generally includes digital, analog, mixed-signal, and often radio-frequency circuitry and functions, all on a single chip.

On-chip sensors (OCS) are known to implement techniques such as adaptive voltage scaling (AVS) and dynamic voltage/frequency scaling (DVFS) to dynamically optimize the power and performance of a SOC by monitoring the OCS output under the process variation(s). On the other hand, the SOC also relies on the OCS to create an aging (over time) guardband for reliability purposes. To ensure a safe guardband, the OCS is designed to perform as a bounding device as it ages. To perform properly, the OCS should drift more than the most sensitive logic structure on the chip, and thus require more compensation (typically more VDD) than other circuits to resume its time zero performance.

Conventional OCSs can be based on ring oscillators (ROs). The RO frequency is measured as an indicator of the circuit's performance. Due to the close-loop nature of a RO, the RO's sensitivity to aging is limited due to the averaging effect of its delay drift. Although the sensitivity of the RO can be improved through transistor upsizing and increased transistor gate stacking, this improvement results in the loss of otherwise usable die size.

One example RO-based OCS is the NOR3 and/or NAND3 version of the SMARTREFLEX™ sensor from Texas Instruments Incorporated. As known in the art, an odd number of logic stages with feedback from the output to the input enables oscillation. Load capacitors ($C_L$) to ground are generally added (typically 10 fF to 100 fF) to adjust the oscillation frequency. Such OCS are disclosed along with related circuitry and methods for utilizing in U.S. Pat. Nos. 7,307,471 and 7,793,119 both to Gammie et al. and assigned to Texas Instruments Incorporated (hereafter Gammie '471 and Gammie '119), the same assignee as the assignee of this patent application. The subject matter in Gammie '471 and Gammie '119 are both incorporated by reference into this patent application.

SUMMARY

Disclosed embodiments describe a variability and aging compensating on-chip sensor (OCS) related to the SMARTREFLEX™ ring oscillators (RO)-based sensors provided by Texas Instruments Incorporated, modified to have a gate structure including at least one disclosed discharge or charge path that can be active during charging or discharging. As used herein, a disclosed OCS may be on the IC itself, or in the scribe line of a substrate (e.g., a wafer) having a plurality of ICs.

At least one NOR PMOS stack is for disclosed OCS including NOR gates and/or at least one NAND NMOS stack is for disclosed OCS including NAND gates. Disclosed discharge and charging paths have been found to further increase the delay contribution from the transistor stack leading to a higher $V_{DD}$ sensitivity for a given aging induced $\Delta Vt$, and the discharge/charge path leads to more current needed, resulting in a lower effective Vt leading to a lower sensitivity to $\Delta VDD$. Higher Vt sensitivity with lower VDD sensitivity is recognized herein to be helpful when a larger (safer) guardband is needed. For example, drawing more current compared to the NOR3 gate in the known SMARTREFLEX™ OCS 100 shown in FIG. 1B described below, not only is recognized to increase the sensor's frequency response to PMOS device aging, but also reduces the sensor's undesirable ability to restore its performance with VDD compensation.

The combination of these factors enables a higher (larger) OCS guardband, which can have a strong dependency on the effectiveness of the pull down path for OCS including NOR and/or pull up path for OCS including NAND. For example, by tuning the size of the PMOS device(s) in the disclosed pull down path for OCS NOR or the size of the NMOS device(s) in the disclosed pull up path for OCS NAND, the sensitivity of the OCS can be designed to be set to a desired value. Through an optional second serial connected PMOS for NOR-based OCS or serial connected NMOS for NAND-based OCS in the disclosed discharge/charge path, the PMOS pull down path for OCS NOR and/or the NMOS pull up path for OCS NAND can also be shut off. In this case, a lower relative guardband provided by the OCS is similar to the guardband provided by SMARTREFLEX™ sensors disclosed by Gammie '471 and Gammie '119, which can be switchably provided by disclosed OCS having this feature using a suitable enable signal. This switching feature may be desirable because as noted above, switching off the discharge/charge path results in the standard device and thus the current (i.e., power) dissipation will be a little bit lower if that is a user' consideration. Also, it may also be the case that after going through the flow in FIG. 3B described below, that the bounding guardband provided by the standard configuration is sufficient.

Compared with the known SMARTREFLEX™ sensors described above, disclosed OCSs uniquely have 1) for OCS including NOR an extra PMOS pull down discharge path including at least one PMOS device inserted between the NOR gate PMOS stack, making it more sensitive to PMOS degradation under negative-bias temperature instability (NBTI), 2) and/or for OCS including NAND an extra NMOS pull up charging path inserted between the NAND gate NMOS stack, making it more sensitive to NMOS degradation under positive-bias temperature instability (PBTI), and optionally 3) a serial connected PMOS (for NOR-based OCS)/NMOS (for OCS NAND) to control the on/off of the disclosed pull down or pull up discharge/charge path.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1A:
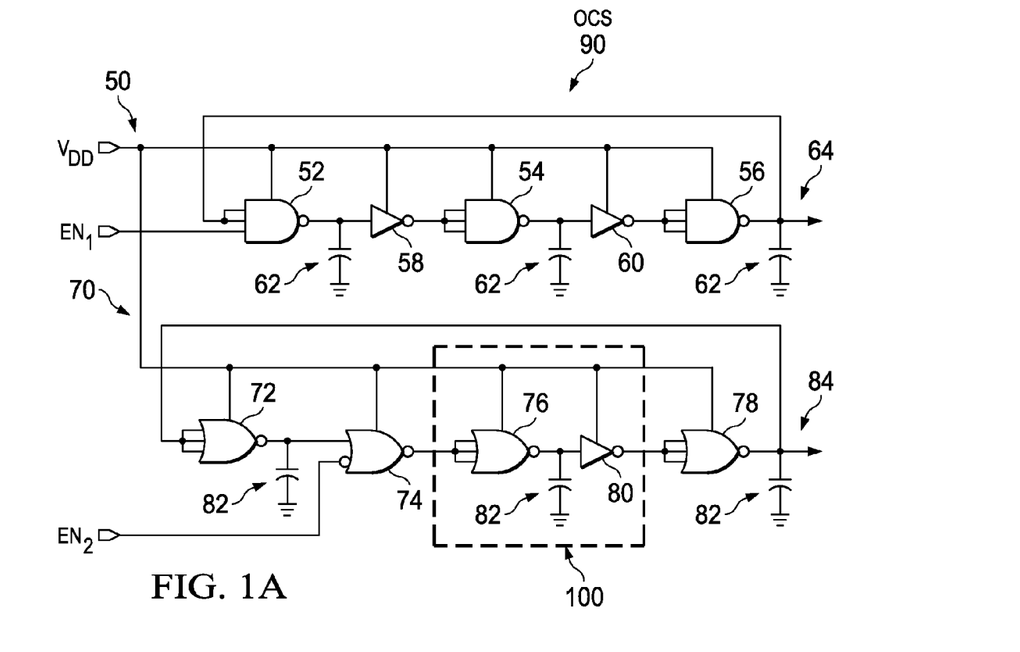
FIG. 1A illustrates an example OCS comprising a first NAND-based ring oscillator and a second NOR-based ring oscillator that include logic elements having disclosed discharge and charge paths, respectively, that can be used with an adaptive voltage scaling system (AVS), according to an example embodiment.

FIG. 1A illustrates an example OCS 90 comprising a first ring NAND-based oscillator 50 and a second NOR-based ring oscillator 70 that can each include logic elements having disclosed discharge/charge paths, which can be used with an adaptive voltage scaling system (AVS) according to an example embodiment. As an example, the first ring oscillator 50 and the second ring oscillator 70 can each be included in the target performance circuit. OCS 90 without its logic elements having disclosed discharge/charge paths is disclosed in Gammie '119 and is marketed as a SMARTREFLEX™ sensor from Texas Instruments Incorporated. For example, OCS 90 can provide the performance sensor for the AVS system 10 shown in FIG. 1 of Gammie '119.

The first ring oscillator 50 includes NAND-gates 52, 54, and 56, as well as inverters 58 and 60, where the output of the NAND-gates 56 is fed back to an input of NAND-gates 52. Each of the NAND-gates 52, 54, and 56, as well as the inverters 58 and 60, are powered by the supply voltage $V_{DD}$, which could be supplied from a variable (controllable) power supply. The NAND-gates 54 and 56 each have three common inputs, such that they behave as an inverter. The NAND-gate 52 has two common inputs and an enable input $EN_1$. The first ring oscillator 50 also includes capacitors 62 interconnecting the NAND-gate 52 and the inverter 58, the NAND-gate 54 and the inverter 60, and the NAND-gates 56 and 52. The capacitors 62 can be sized to adjust the frequency of oscillation of the first ring oscillator 50, for example, to account for a worst case scenario application use frequency of the IC. The enable input $EN_1$ can be provided by an adaptive voltage controller to enable the first ring oscillator 50, such that a number of oscillations can be counted at an output 64. The first ring oscillator 50 includes the NAND-gates 52, 54, and 56 such that the first ring oscillator 50 can be implemented to set the voltage $V_{DD}$ for a target operating frequency of an application use of the IC that may be specifically associated with the switching of NMOS devices.

The second ring oscillator 70 includes NOR-gates 72, 74, 76, and 78, as well as an inverter 80, where the output of the NOR-gates 78 is fed back to an input of NOR-gates 72. Each of the NOR-gates 72, 74, 76, and 78, as well as the inverter 80, are also powered by the supply voltage $V_{DD}$, similar to the ring oscillator 50. The NOR-gates 74, 76, and 78 each have three common inputs, such that they behave as an inverter. The NOR-gate 72 has two common inputs and an enable input $EN_2$. The second ring oscillator 70 also includes capacitors 82 interconnecting the NOR-gates 72 and 74, the NOR-gate 76 and the inverter 80, and the NOR-gates 78 and 72. The capacitors 82 can be sized to adjust the frequency of oscillation of the second ring oscillator 70, for example, to account for a worst case scenario application use frequency of the IC. The enable input $EN_2$ can be provided by an AVS system to enable the ring oscillator 70, such that a number of oscillations can be counted at an output 84. The second ring oscillator 70 includes the NOR-gates 72, 74, 76, and 78 such that the second ring oscillator 70 can be implemented to set the voltage $V_{DD}$ for a target operating frequency of an application use of the IC that may be specifically associated with the switching of PMOS devices.

The NMOS and PMOS devices can be configured in a variety of ways. One configuration is MOS devices having a metal gate on a high-k dielectric. Such metal gate on high-K dielectric MOS devices have been found to be particularly prone to age-related parameter shifts (e.g., threshold voltage, Vt), and can thus significantly benefit from disclosed embodiments. As used herein, the term "high-k" dielectric refers to a material with a high dielectric constant (k) as compared to silicon dioxide, being 5 or more (vs. 3.9 for silicon dioxide). However, disclosed embodiments can be used in ICs having non-metal gate and/or non-high-k gate dielectric, including conventional MOS gate stacks, such as polysilicon gate/SiON gate dielectric process technologies as one particular example.

As an example, the ring oscillator 50 and ring oscillator 70 can be configured to begin oscillating in response to receiving a logic high (i.e., logic 1) input at the respective enable inputs $EN_1$ and $EN_2$ shown from an AVS system. The frequency of oscillations of each of the ring oscillator 50 and the ring oscillator 70 is adjusted based on the magnitude of the voltage $V_{DD}$. It is to be understood that, despite both the ring oscillator 50 and the ring oscillator 70 being powered by the voltage $V_{DD}$ in this example, each could be powered by a separate and individually variable power supply voltage. The frequency of oscillations can be measured by an adaptive voltage controller based on incrementing a counter in a performance sensor for every change of state at the respective outputs 64 and 84. The resultant number of counts, sampled over a period of time, can be compared (e.g., by logic in an adaptive voltage controller) with one or more of the characteristic numbers for a determination of whether one or both of the ring oscillator 50 and the ring oscillator 70 achieves the target frequency based on the voltage $V_{DD}$.

In addition to the adaptive voltage controller controlling $V_{DD}$ for the ring oscillator 50 and the ring oscillator 70 by setting $V_{DD}$ based on the ring oscillator 50 and/or the ring oscillator 70 to achieve the target frequency, an aging controller can also enable and/or disable the ring oscillator 50 and the ring oscillator 70. For example, the aging controller can selectively enable and disable each of the ring oscillator 50 and the ring oscillator 70 to age the semiconductor material of which the transistors in the ring oscillators 50 and 70 are made at a rate that is substantially similar to the semiconductor material of which the transistors for the application use of the IC are made.

As an example, because the deleterious effects of aging in NMOS transistors occur when they are held in an activated state, the aging controller may provide a logic high input at the enable input $EN_1$ during application use of the IC, thus enabling the ring oscillator 50. Accordingly, the ring oscillator 50 may be enabled at substantially all times other than, for example, while the IC is in a sleep mode to age the ring oscillator 50 substantially at the same rate as NMOS transistors in the IC. As another example, because the deleterious effects of aging in PMOS transistors occur when they are held in a deactivated state, the aging controller may provide a logic low input at the enable input $EN_2$ during application use of the IC, thus disabling the ring oscillator 70.

In addition, the aging controller may disable the ring oscillator 70 upon a specific logic state of the output 82, such that the ring oscillator 70 is held at a static state when the PMOS transistors that such oscillator includes are deactivated. For example, the NOR-gates 76 and 78 can be configured larger than the NOR gates 72 and 74, and the ring oscillator 70 can be disabled at a time that the PMOS transistors in the NOR-gates 76 and 78 are deactivated, such that the NOR-gates 76 and 78 can be aged in a worst case scenario for tracking the age of the semiconductor material of the IC. Accordingly, the ring oscillator 70 may be disabled at substantially all times other than, for example, an AVS mode, when the adaptive voltage controller sets the voltage $V_{DD}$, to age the ring oscillator 70 at the same rate as PMOS transistors in the IC. It is to be understood that various portions of the associated IC may age at different rates. Thus, the aging controller can control the ring oscillators 50 and 70 to age based on a worst case aging scenario of the associated IC, such that performance of the associated IC is not compromised.

It is to be understood that the ring oscillators 50 and 70 are not intended to be limited to NAND-gates and NOR-gates, respectively, as demonstrated in the example of FIG. 1A. For example, both the first ring oscillator 50 and the second ring oscillator 70 can be configured to include additional gates than those demonstrated in the example of FIG. 1A. In addition, any of a variety of other types of ring oscillators (e.g., odd number of inverters) can be implemented to set the voltage $V_{DD}$ of a variable power supply. In addition, a target performance circuit can include more or less ring oscillators than two ring oscillators, such as one or both of the ring oscillator 50 and ring oscillator 70 in the OCS 90 shown in FIG. 1A.

Figure 1B:
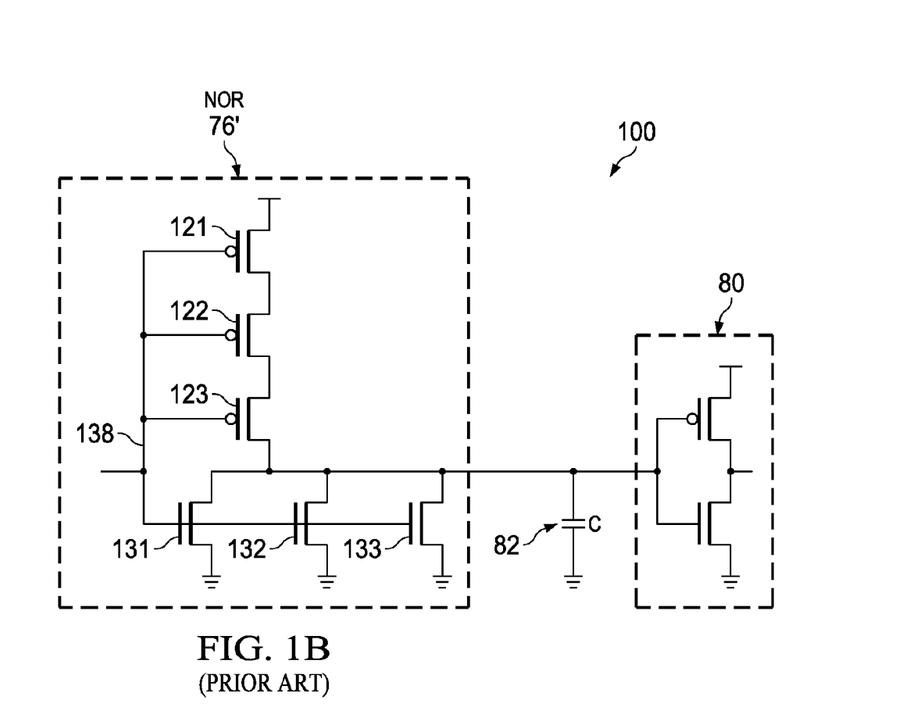
FIG. 1B is a transistor level schematic of the NOR gate coupled to the inverter encircled in FIG. 1A for a known circuit arrangement.

There is a dashed line shown in FIG. 1A which encircles a sub-circuit 100 comprising NOR gate 76 coupled to the inverter 80 with a capacitor 82 to ground at the common node between the NOR gate 76 and the inverter 80, for which a transistor level schematic is based on that is shown in FIG. 1B. Sub-circuit 100 is marked as prior art with the NOR gate 76 in FIG. 1A now shown as NOR gate 76' as it is shown excluding a disclosed discharge path in the logic, such as shown in FIG. 2A.

Known NOR gate 76' has its three (3) inputs tied together to as common gate terminal 138 and includes a source-drain (S-D) series stack of p-channel metal-oxide semiconductor (PMOS) devices 121, 122, 123 all having respective gates coupled together to the common gate terminal 138. A plurality of NMOS pull down transistors 131, 132, 133 are also included having respective gates coupled to the common gate terminal 138 having a common drain including respective drains of the plurality of NMOS pull down transistors 131, 132, 133 connected to a drain of PMOS device 123, and respective sources coupled together to the ground node shown.

Figure 2A:
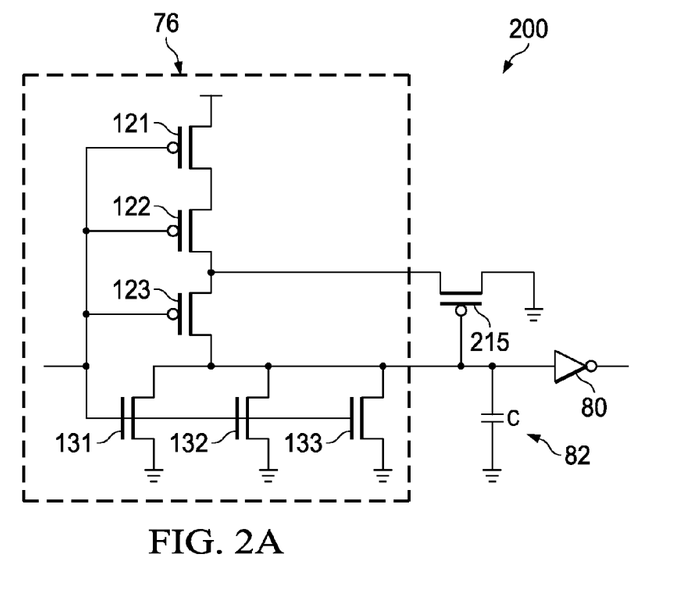
FIG. 2A is a transistor level sub-circuit schematic of a portion of a disclosed OCS being a NOR gate coupled to an inverter that further includes a disclosed discharge path comprising a single pull down PMOS transistor operable during the charging of the NOR3 PMOS stack, according to an example embodiment.

FIG. 2A is a transistor level sub-circuit schematic 200 of a portion of a disclosed OCS being a NOR gate 76 coupled to an inverter 80 that includes a disclosed discharge path comprising a single pull down PMOS transistor 215 operable during the charging of the NOR3 PMOS stack 121, 122, 123 beyond the otherwise analogous structure (NOR gate 76') in the sub-circuit 100 shown in FIG. 1B, according to an example embodiment. Disclosed discharge paths can be added to any combination of the NOR PMOS stacks, including all of the NOR PMOS stacks in one particular embodiment. Although the PMOS stack 121, 122, 123 in FIG. 2A and elsewhere in this application is generally shown having three (3) stacked transistors, the PMOS stack for disclosed NOR comprising OCS can more generally have 2 or more (e.g., 2, 3, 4, 5, . . . ) PMOS transistors in the stack. In one embodiment all MOS transistors on the OCS and IC being served by the OCS have a gate stack comprising metal gate on high-k dielectric. As noted above, the gate stacks can also be non-metal gate and/or non-high-k gate dielectric as well.

Figure 2B:
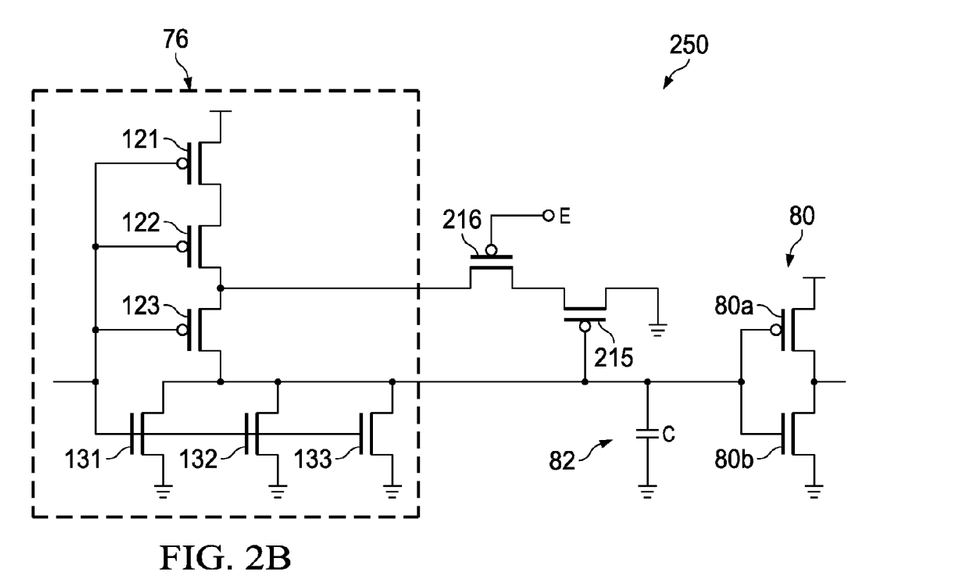
FIG. 2B is a transistor level sub-circuit schematic of a portion of an OCS being a NOR gate coupled to an inverter that includes a disclosed discharge path comprising a first pull down PMOS transistor in series with a second pull down PMOS transistor with enable input operable during the charging of the NOR3 PMOS stack when enabled, according to an example embodiment.

FIG. 2B is a transistor level sub-circuit schematic 250 of a portion of a disclosed OCS being a NOR gate 76 coupled to an inverter 80 that includes a disclosed discharge path comprising a first pull down PMOS transistor 215 in series with a second pull down PMOS transistor 216 operable during the charging up of NOR3 PMOS stack 121, 122, 123, according to an example embodiment. The inverter 80 is also shown as being PMOS 80a in series and common gate with NMOS 80b. In operation, the pull down path (first pull down PMOS transistor 215 in series with PMOS transistor 216) is only on when an enable (E) signal applied to the gate of PMOS 216 is sufficiently low (e.g., <-0.7 V) turning on PMOS 216.

The single pull down PMOS transistor 215 shown in FIG. 2A or two serial connected PMOS pull down transistors (FIG. 2B, when enabled) connected to the NOR PMOS stack provides a discharge path during the PMOS stack 121, 122, 123 charge up. The discharge current drawn by the discharge path further increases the delay contribution from PMOS stack 121, 122, 123 leading to a higher sensitivity to changes in threshold voltage ($\Delta V_t$) Moreover, the discharge path results in more current being needed leading to a lower effective $V_t$, which leads to a lower sensitivity to a change in the power supply level ($\Delta V_{DD}$), with essentially no degradation for the first pull down PMOS transistor PMOS 215 shown in FIG. 2B. At DC stress, first pull down PMOS transistor PMOS 215 can be shut off with NOR gate output "1" (no degradation). At AC stress, the $V_{gd}$ of first pull down PMOS transistor PMOS 215 can be around $V_t$ only when the NOR gate output is "0" (very small degradation). Overall, the inclusion of PMOS 215 provides a higher effective guardband. The enable (E) input to PMOS transistor 216 can be controlled by a SOC (or other controller) to turn on/off the path, which as described above can be used to provide dual guardband levels.

Figure 2C:
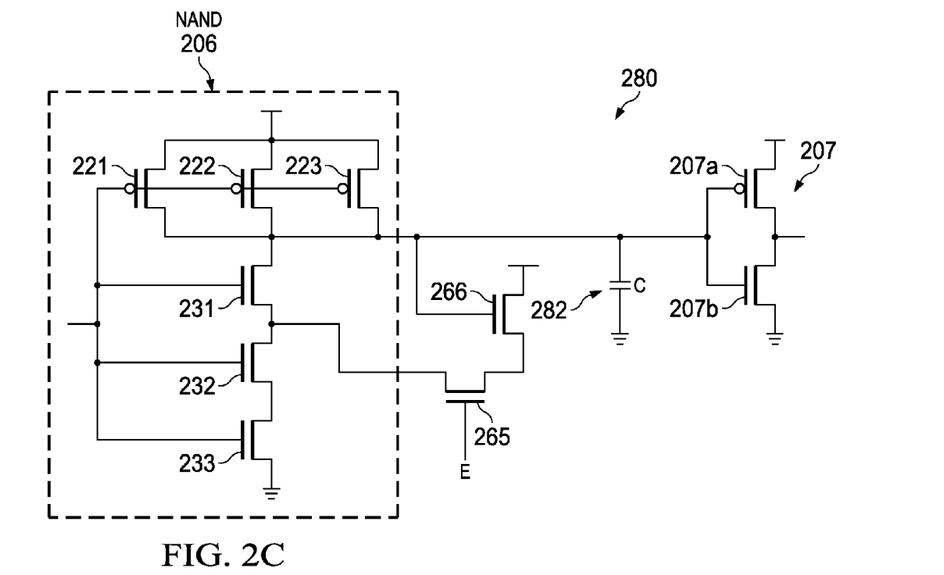
FIG. 2C is a transistor level sub-circuit schematic of a portion of an OCS being a NAND3 gate coupled to an inverter that includes a disclosed charging path comprising a pair of series connected NMOS transistors one having an enable input operable during discharging of the NAND3 NMOS stack when enabled, according to an example embodiment. This circuit is the complement of the portion of an OCS shown in FIG. 2B.

FIG. 2C is a transistor level sub-circuit schematic 280 of a portion of a disclosed OCS being a NAND3 gate 206 coupled to an inverter 207 shown as PMOS 207a in series and common gate with NMOS 207b that includes a disclosed charging path comprising a pair of series connected NMOS transistors 266, 265 (NMOS 265 with an enable input) operable during the discharging of the NAND3 NMOS stack 221, 222, 223 when enabled, according to an example embodiment. This sub-circuit is the complement of the sub-circuit 250 shown in FIG. 2B. A load capacitor 282 is shown. Analogous to as noted above, although the NMOS stack 221, 222, 223 shown in FIG. 2C and elsewhere in this application is generally shown having three (3) stacked transistors, the NMOS stack for NAND-based OCS can have more have 2 or more (e.g., 2, 3, 4, 5, . . . ) NMOS transistors in the stack.

Figure 3A:
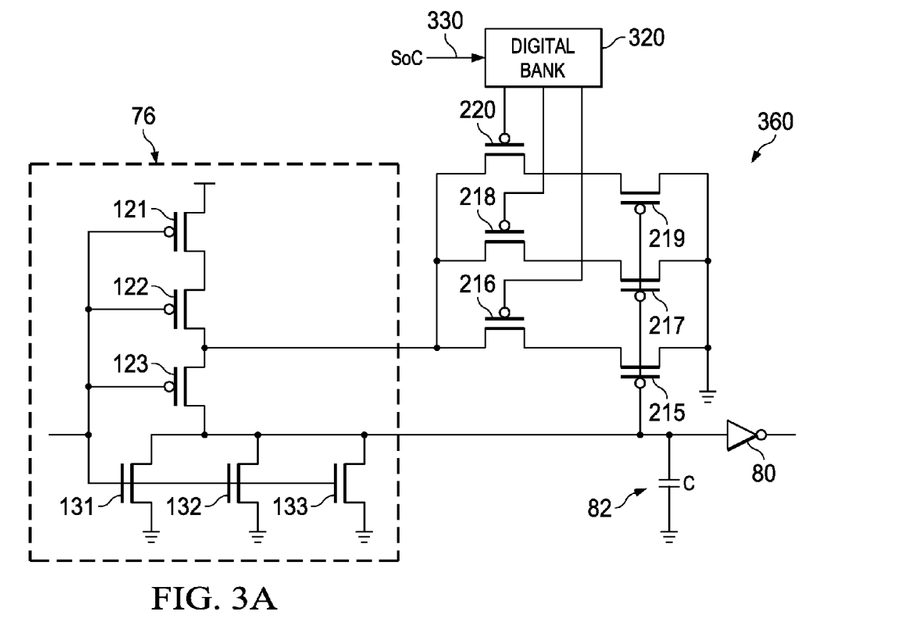
FIG. 3A demonstrates use of a disclosed OCS with disclosed discharge path that can be used in a Device Parametric Shift Evaluation (DPSE) flow, shown including a SoC providing a digital bank that controls enable inputs to gates of the enable PMOS transistors in the respective PMOS transistor series pull downs in the discharge paths, according to an example embodiment.

FIG. 3A demonstrates implementation of a DPSE flow on a sub-circuit 360 portion of a disclosed OCS with a schematic shown, where the sub-circuit 360 includes NOR gate 76 coupled to an inverter 80, having a plurality of disclosed discharge paths in parallel, according to an example embodiment. The discharge paths shown in FIG. 3A includes 3 pairs of pull down PMOS transistor series pairs with a first pair 215, 216 (PMOS 216 with enable input), a second pair 217, 218 (PMOS 218 with enable input), and a third pair 219, 220 (PMOS 220 with enable input), all in parallel to one another and connected to a node in the NOR PMOS stack 121, 122, 123 to provide a discharge path during PMOS stack 121, 122, 123 charge up.

The SOC 330 is shown providing a scan controlled digital bank 320 that controls the enable (E) inputs to the respective gates of the enable PMOS transistors 216, 218, 220 in the respective PMOS transistor series pull downs in the discharge paths. The digital bank 320 comprises logic circuitry that based on inputs from a controller in the SOC 330 which implements a program that generates the appropriate logic control enable (E) signals to turn on/turn off the discharge and/or charge paths at appropriate times to implement a control objective (here code scanning). A DPSE is used for product qualification, for determining product level aging guardbands, and generally utilizes the burn-in (BI)/High Temperature Operating Life (HTOL)/early failure rate (EFR) infrastructure. As shown in FIG. 3A, the disclosed sub-circuit 360 of the OCS is part of the OCS used in the DPSE flow to set the OCS with codes of sufficient sensitivity. The SOC 330 configures the digital bank 320 so that the digital bank can implement a scan chain controlled sensor configuration allowing adaptive guardband tuning, described below in more detail along with the flow chart and associated method of FIG. 3B.

Figure 3B:
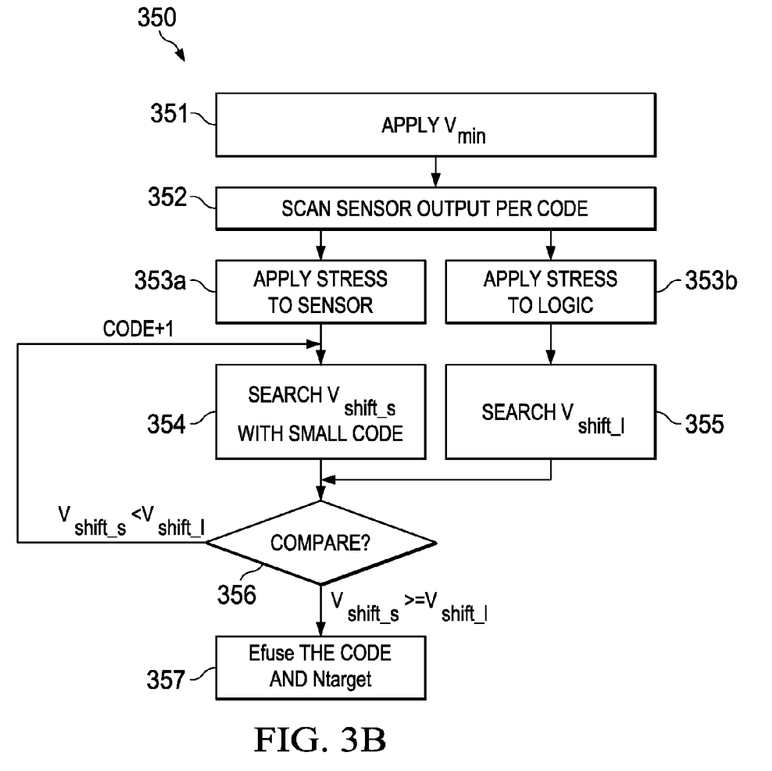
FIG. 3B is a flow chart showing steps for an example adaptive guardband tuning, according to an example embodiment.

FIG. 3B is a flow chart showing steps for an example method 350 of adaptive guardband tuning, according to an example embodiment. Step 351 comprises applying a minimum power supply voltage (Vmin). Vmin is the minimum power supply voltage at which the OCS becomes functional. Step 352 comprises scanning gates of the OCS having enable inputs with a scan code. In this step the strength of the discharge and/or charge path is varied through the applied scan code such that the OCS $V_{DD}$ is higher than the logic $V_{DD}$ on a product circuit to be guardbanded so as to provide a bounding guardband. Step 353a comprises applying a stress, such as HTOL/BI/EFR equivalent aging stress to the OCS and step 353b comprises applying the same stress to the product circuitry (including typically one or more recognized critical path(s) on the IC).

Step 354 comprises searching the OCS for Vshift_s using a small code. A "small code" as used herein means that the step change in discharge/charge strength is small enough to allow fine tuning the proper $V_{DD}$. Step 355 comprises searching the logic circuitry on the product IC for Vshift_1. After the stress, the logic circuitry will have aged and a higher logic $V_{DD}$ is generally needed, and thus that is determined (i.e. Search Vshift_1). In FIG. 3B, V stands for $V_{DD}$.

Step 356 comprises comparing Vshift_s to Vshift_1 to determine if Vshift_s<Vshift_1, or Vshift_s>=Vshift_1. Step 357 comprises Efusing the code to set the frequency and Ntarget. Once the proper $V_{DD}$ of the OCS is determined, for the case of an SOC or a similar device, this value is then essentially "hard-wired" into the SOC $V_{DD}$ controller 420 by setting the value of certain electronic fuses such that the correct $V_{DD}$ can be supplied once the product IC is being used. This correct $V_{DD}$ will result in the OCS having a frequency value or an associated frequency counter value that is referred to herein as Ntarget.

Figure 4:
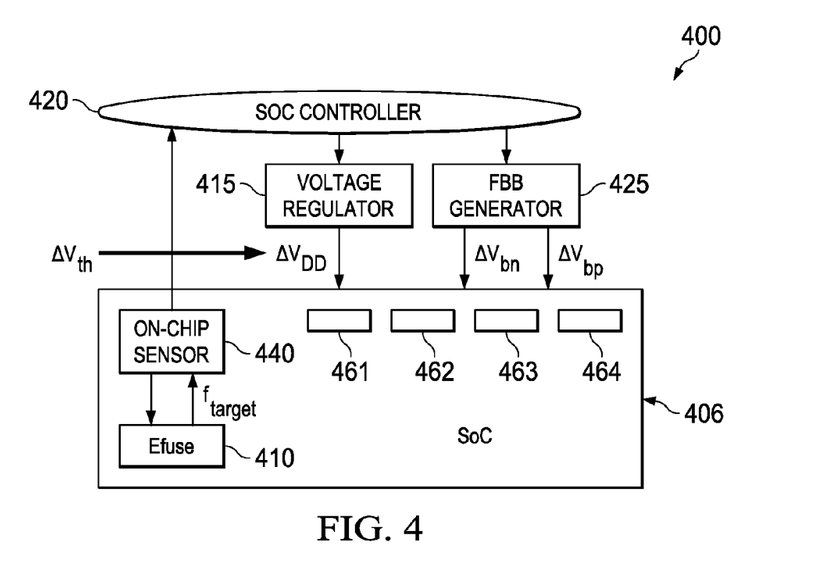
FIG. 4 is a depiction of a SOC chip with a disclosed OCS on the chip having the SOC in an exploded view shown providing an efuse arrangement for setting a frequency target, a supply voltage regulator and a body voltage generator for both PMOS devices and NMOS devices, according to an example embodiment.

FIG. 4 is a depiction of an example IC shown as a SOC 400 having a disclosed OCS (shown as "ON-chip sensor") 440 on the chip, according to an example embodiment. Although shown applied to a SOC, disclosed OCS's can benefit ICs other than SOCs. The SOC 400 is shown in a partially exploded view providing an efuse block (having electronic fuses) 410 for setting a frequency target, a SOC controller 420 coupled to control a voltage regulator 415, and a body voltage generator 425 for both PMOS and NMOS devices. SOC 400 includes a substrate 406 having a semiconductor surface (e.g., silicon) where the OCS 440 and SOC controller 420 are coupled to control the voltage regulator block 415 and body voltage generator block 425 all residing on the SOC chip 400. However, it is also possible for the OCS 440 to alternatively to being on chip as shown in FIG. 4 to instead be stacked on top of the SOC.

The substrate 406 having a semiconductor surface may be an elementary semiconductor such as silicon, germanium, or diamond (carbon), or may also comprise a compound semiconductor such as silicon carbide, gallium arsenide, indium arsenide, and indium phosphide. Substrate 406 may also comprise an alloy semiconductor such as silicon germanium, silicon germanium carbide, gallium arsenic phosphide, and gallium indium phosphide.

The SOC 400 is shown including digital circuitry 461, analog circuitry 462, mixed-signal circuitry 463, and radio-frequency circuitry 464. Although not shown, SOC 400 may include a variety of other circuitry. In one embodiment the OCS 440, digital circuitry 461, analog circuitry 462, mixed-signal circuitry 463, and radio-frequency circuitry 464 all include MOS devices having a gate stack comprising a metal gate on a high-k dielectric, or a non metal gate and/or non-high-k gate dielectric such as SiON with a polysilicon gate.

As the product IC is being used in the field it will undergo aging including aging of the logic critical paths which may be manifested as Vt shifts. A disclosed OCS as the bounding circuit will provide the highest $V_{DD}$ and this same $V_{DD}$ will be generated for the SOC through the SOC controller and voltage regulator. The additional $\Delta V_{DD}$ required to account for the transistor aging (i.e., $\Delta V_{th}$) is therefore noted. The FBB (forward/reverse well voltage bias generator) is another method of controlling the IC performance. The $\Delta V_{bn}$ and $\Delta V_{bp}$ adjust the pwell well and nwell well bias, respectively. The FBB generator 425 is shown in FIG. 4 is shown to denote a general DVS/DVFS system.

Advantages of disclosed OCS having disclosed discharge/charge paths are numerous. For example, disclosed OCS can provide a higher guardband as compared to available RO sensors including the SMARTREFLEX™ sensors described above. The guardband can be adjusted through sizing of the PMOS/NMOS devices in the pull down/up paths. Through controlling the on/off of the discharge/charge paths for multi-series transistor embodiments, disclosed OCS provide a dual mode guardband, making it flexible to be used in real product. Moreover, disclosed discharge/charge paths have little impact on the OCS's time zero characteristic as they result in only a small additional power dissipation (i.e. ≤a few percent) during OCS operation, and are not dissipating power when the OCS is not switching. Disclosed OCS also provide essentially the same dynamic performance range at time zero compared with known SMARTREFLEX™ sensors.

Disclosed OCS can be included on the IC product and can be used for real-time monitoring during customer's use of the IC if desired. Disclosed OCS can also be placed in the scribe-line of the substrate (e.g. wafer) and be tested in the wafer fab facility as an early look-ahead, as well as at product burn-in (B/I) for guardband adjustment purposes. Disclosed OCS may also be on the IC itself, or as disclosed above off-chip (e.g., stacked on top of the IC) as well.

Figure 5:
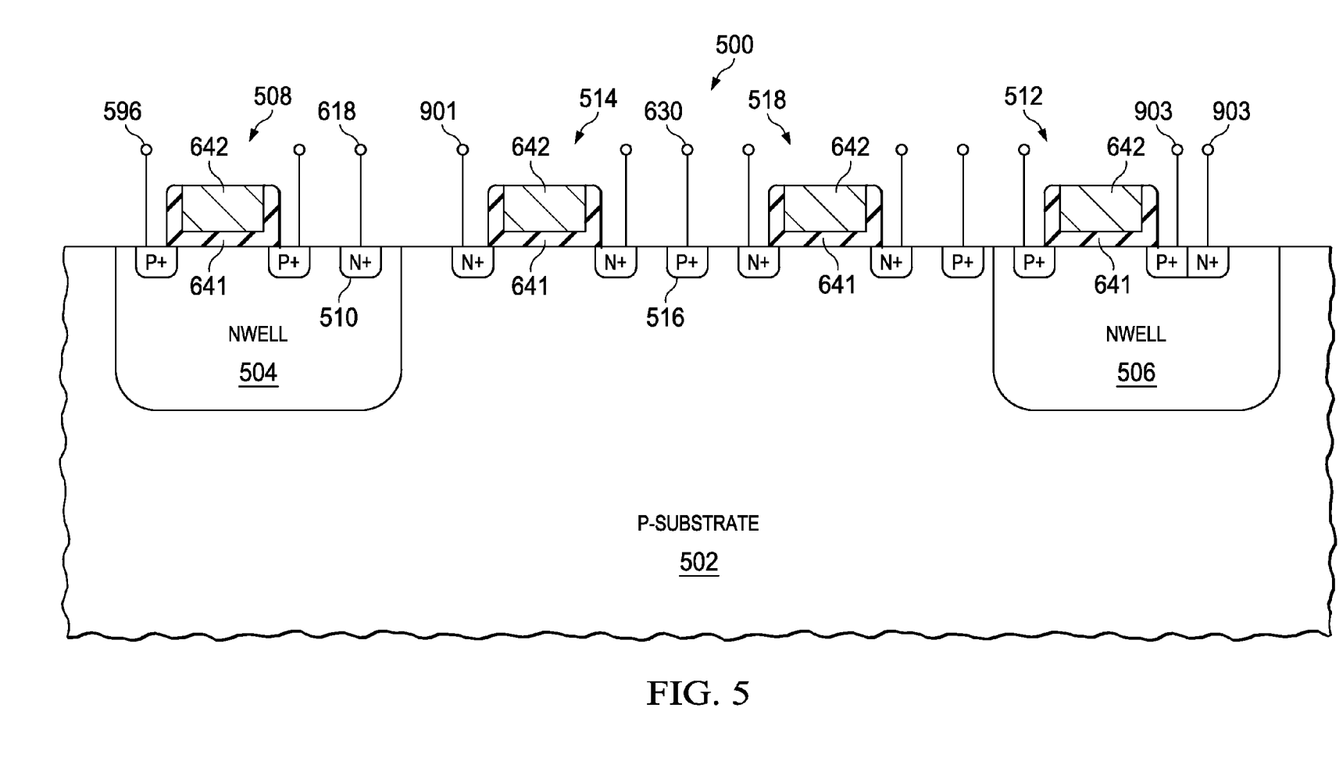
FIG. 5. is a cross-sectional view of a portion of a logic circuit (e.g., a complementary metal oxide semiconductor, or CMOS circuit) comprising an NMOS transistor and a PMOS transistor that can be used in disclosed ICs and OCS having gate stacks including a metal gate on a high-k dielectric.

A cross-sectional view of a portion of a logic circuit 500 (e.g., a complementary metal oxide semiconductor, or CMOS) comprising an NMOS transistor and a PMOS transistor is shown in FIG. 5. Specifically, the portion of a logic circuit 500 comprises a p-substrate 502, an n-well 504, and another n-well 506. The n-well 504 comprises a PMOS core 508 and a PMOS body 510. The n-well 506 comprises a PMOS input/output (I/O) 512. The p-substrate 502 comprises an NMOS core 514, an NMOS body 516, and an NMOS I/O 518. The PMOS core 508 may couple to a connection to voltage source 596. The PMOS body 510 is coupled to connection 618. The NMOS body 516 is coupled to connection 630. Both the NMOS core 514 and the NMOS I/O 518 are coupled to voltage connection 901, which connection 901 also may be provided to the source connections of one or more NMOS transistors throughout the circuit paths. The PMOS I/O 512 is coupled to connection 903, which connection 903 serves as an input/output connection. Each gate stack comprises a metal gate 642 on a high-k dielectric 641 (e.g., in one particular embodiment $HfO_2$), where the metal gate material may be different for the PMOS and NMOS.

EXAMPLES

Disclosed embodiments are further illustrated by the following specific Examples, which should not be construed as limiting the scope or content of this Disclosure in any way.

Figure 6A:
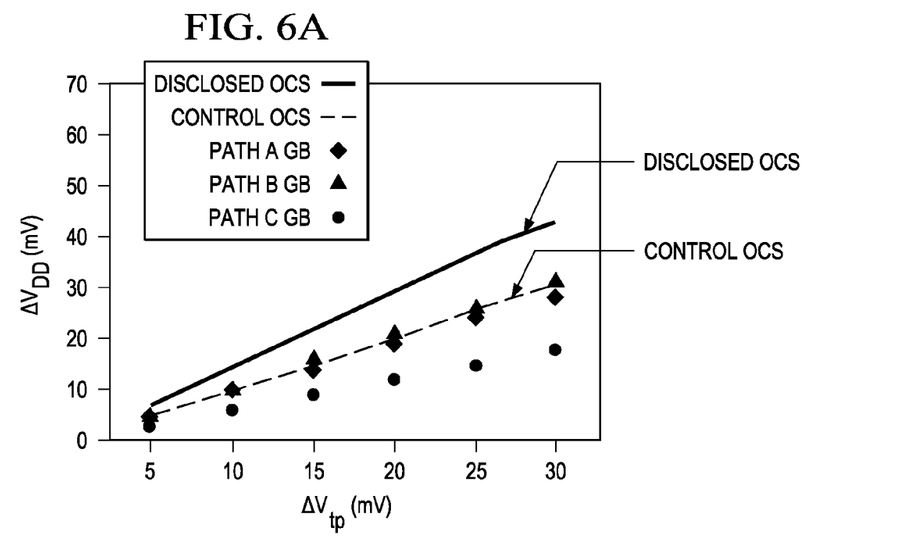
FIGS. 6A and 6B show $\Delta V_{DD}$ vs. $\Delta V_t$ data including data from some example balanced and unbalanced critical paths, a control OCS, and a disclosed OCS evidencing only disclosed OCS can provide the proper (i.e. highest $V_{DD}$) bounding $V_{DD}$ guardband (GB), with the GB shown provided by the disclosed OCS being large enough to be safe GBs to guard balanced and unbalanced paths for both NBTI and PBTI.
Figure 6B:
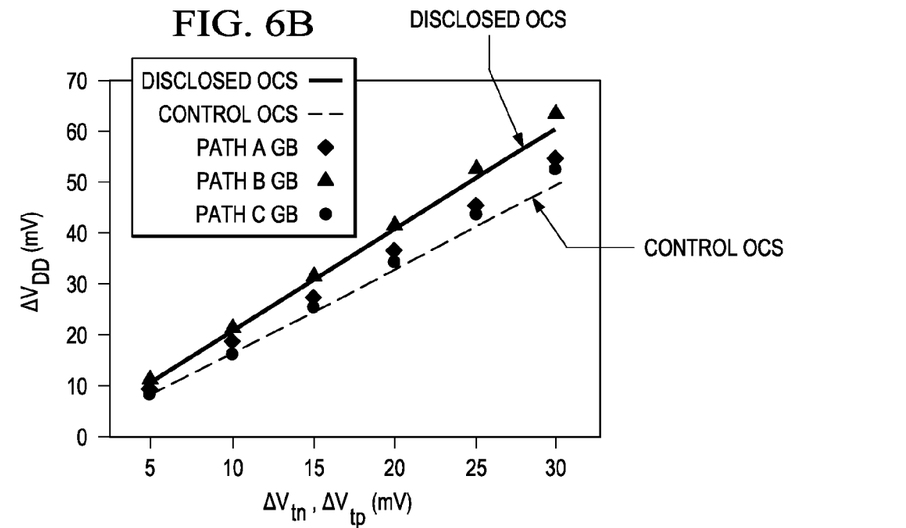

It is noted that the data described below relative to FIG. 6A and 6B are simulations that have been calibrated experimentally. In one set of simulations, a range of logic critical paths including MOS transistors configured as a plurality of series connected inverters with intervening load capacitors having metal gate/high-k gate stacks shown in FIG. 6A and FIG. 6B as Path A, Path B and Path C were tested for voltage shift, and compared to the voltage shift for a known SMARTREFLEX™ sensor. The known SMARTREFLEX™ sensor had metal gate/high-k gate stacks shown as the control OCS which was based on OCS 90 shown in FIG. 1A with logic based on NOR 76' in FIG. 1B, and the disclosed OCS had the OCS 90 circuit schematic having metal gate/high-k gate stacks with added disclosed discharge paths coupled to the NOR PMOS stacks and disclosed charge paths for the NAND NMOS stacks as described above.

Path A was a balanced path where the transistor sizes in the inverters were all the same size (1×; minimum size), while Path B was an unbalanced path with 9×NMOS and 1×PMOS for the inverters, while Path C was an unbalanced path with 9×PMOS and 1× NMOS for the inverters. The magnitude of the $V_{DD}$ increase to recover transistor induced circuit aging due to DC stress is reflected in $\Delta V_{DD}$, and the aging magnitude is quantified by $\Delta Vtp$ (in mv) in FIG. 6A (NBTI only), and both $\Delta Vtn$ and $\Delta Vtp$ (in my) in FIG. 6B (PBTI=NBTI). These FIGs. provide data indicating that only disclosed OCS can provide the proper (i.e. highest $V_{DD}$) bounding $V_{DD}$ guardband, with the guardband (GB) shown provided by the disclosed OCS being large enough to be safe GBs to guard balanced and unbalanced paths for both NBTI and PBTI.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, other types of circuits and/or oscillators can be implemented instead of ring oscillators. As such, target performance may not be limited to a target frequency, but could include any of a variety of circuit performance characteristics, and further may not be limited to just one

The invention claimed is:

1. A ring-oscillator-based on-chip sensor (OCS), comprising:
a substrate having a semiconductor surface upon which said OCS is formed; said OCS including:
an odd number of digital logic stages formed in and on said semiconductor surface including:
a first stage and a last stage each including at least one NOR gate including a first gate stack and/or a NAND gate including a second gate stack;
a feedback connection from an output of said last stage to an input of said first stage, and
at least one discharge path including at least a first p-channel metal-oxide semiconductor (PMOS) device coupled between said first gate stack and a ground pad, or at least one charge path including at least a first n-channel metal-oxide semiconductor (NMOS) device coupled between said second gate stack a power supply pad.

2. The OCS of claim 1, wherein said OCS includes said NOR gate, provides said discharge path, and further includes at least a second PMOS device having an enable input in series with said first PMOS device.

3. The OCS of claim 1, wherein said OCS includes said NAND gate, provides said charge path, and further includes at least a second NMOS device having an enable input in series with said first NMOS device.

4. The OCS of claim 3, wherein said OCS further includes said NOR gate, provides said discharge path, and further includes at least a second PMOS device having an enable input in series with said first PMOS device.

5. The OCS of claim 1, wherein said OCS is formed on said semiconductor surface.

6. The OCS of claim 1, wherein said at least one discharge path includes a plurality of said discharge paths electrically in parallel, and/or wherein said at least one charge path includes a plurality of said charge paths electrically in parallel.

7. The OCS of claim 4, further comprising a system on a chip (SOC) sharing said semiconductor surface with said OCS, said SOC providing a scan controlled digital bank that controls enable inputs which are coupled to at least one of said enable input of said second PMOS device and said enable input of said second NMOS device.

8. A system on a chip (SOC), comprising:
a substrate having a semiconductor surface upon which said SOC is formed; said SOC including:
digital circuitry, analog circuitry, and mixed-signal circuitry in and on said semiconductor surface; and
a ring-oscillator-based on-chip sensor (OCS) in and on said semiconductor surface; including:
an odd number of digital logic stages formed in and on said semiconductor surface including:
a first stage and a last stage each including at least one NOR gate including a first gate stack and/or a NAND gate including a second gate stack;
a feedback connection from an output of said last stage to an input of said first stage, and
at least one discharge path including at least a first p-channel metal-oxide semiconductor (PMOS) device coupled between said first gate stack and a ground pad, or at least one charge path including at least a first n-channel metal-oxide semiconductor (NMOS) device coupled between said second gate stack a power supply pad.

9. The SOC of claim 8, wherein said OCS includes said NOR gate, provides said discharge path, and further includes at least a second PMOS device having an enable input in series with said first PMOS device.

10. The SOC of claim 8, wherein said OCS includes said NAND gate, provides said charge path, and further includes at least a second NMOS device having an enable input in series with said first NMOS device.

11. The SOC of claim 10, wherein said OCS further includes said NOR gate, provides said discharge path, and further includes at least a second PMOS device having an enable input in series with said first PMOS device.

12. The SOC of claim 8, wherein said at least one discharge path includes a plurality of said discharge paths electrically in parallel, and/or wherein said at least one charge path includes a plurality of said charge paths electrically in parallel.

13. The SOC of claim 11, wherein said SOC provides a scan controlled digital bank that controls enable inputs which are coupled to at least one of said enable input of said second PMOS device and said enable input of said second NMOS device.

14. The SOC of claim 11, wherein said OCS, said digital circuitry, said analog circuitry, and said mixed-signal circuitry all include MOS devices having a gate stack comprising a metal gate on a high-k dielectric.

15. A method for adaptively scaling voltage in an integrated circuit (IC), the method comprising:
providing a ring-oscillator-based on-chip sensor (OCS), including a substrate having a semiconductor surface upon which said OCS is formed; said OCS including an odd number of digital logic stages formed in and on said semiconductor surface including a first stage and a last stage each including at least one NOR gate including a first gate stack and/or a NAND gate including a second gate stack; a feedback connection from an output of said last stage to an input of said first stage, and at least one discharge path including at least a first p-channel metal-oxide semiconductor (PMOS) device coupled between said first gate stack and a ground pad, or at least one charge path including at least a first n-channel metal-oxide semiconductor (NMOS) device coupled between said second gate stack a power supply pad,
obtaining a frequency measurement from said OCS;
determining a change in at least one voltage selected from VDD, Vbn and Vbp for said IC from said frequency measurement.

16. The method of claim 15, wherein said OCS further includes said NOR gate, provides said discharge path, and further includes at least a second PMOS device having an enable input in series with said first PMOS device or a second NMOS device having an enable input in series with said first NMOS device, said method further comprising:

using a scan controlled digital bank to control enable inputs which are coupled to at least one of said enable input of said second PMOS device and said enable input of said second NMOS device.

17. The method of claim 15, further comprising scanning gates of said OCS having said enable inputs with a scan code, wherein a strength of said discharge path and/or said charge path is varied through said scan code such that a $V_{DD}$ of said OCS (OCS $V_{DD}$) is higher than a logic $V_{DD}$ on product circuitry to be guardbanded by said OCS so as to provide a bounding guardband.

* * * * *